US012599047B2

(12) United States Patent
Chaji et al.

(10) Patent No.: US 12,599,047 B2
(45) Date of Patent: Apr. 7, 2026

(54) OPTOELECTRONIC MICRODEVICE

(71) Applicant: VueReal Inc., Waterloo (CA)

(72) Inventors: Gholamreza Chaji, Waterloo (CA);
Hossein Zamani Siboni, Waterloo
(CA); Ehsanollah Fathi, Waterloo (CA)

(73) Assignee: VueReal Inc., Waterloo (CA)

( * ) Notice: Subject to any disclaimer, the term of this
patent is extended or adjusted under 35
U.S.C. 154(b) by 334 days.

(21) Appl. No.: 18/251,502

(22) PCT Filed: Nov. 12, 2021

(86) PCT No.: PCT/CA2021/051610
§ 371 (c)(1),
(2) Date: May 2, 2023

(87) PCT Pub. No.: WO2022/099418
PCT Pub. Date: May 19, 2022

(65) Prior Publication Data
US 2024/0030195 A1      Jan. 25, 2024

Related U.S. Application Data

(60) Provisional application No. 63/271,761, filed on Oct.
26, 2021, provisional application No. 63/123,132,
filed on Dec. 9, 2020, provisional application No.
63/112,885, filed on Nov. 12, 2020.

(51) Int. Cl.
H01L 25/075      (2006.01)
H10H 20/01      (2025.01)

(52) U.S. Cl.
CPC ..... H01L 25/0753 (2013.01); *H10H 20/0364*
(2025.01)

(58) Field of Classification Search
CPC ............ H01L 25/0753; H10H 20/0364; H10H
20/01; H10H 20/857; H10F 39/103;
H10K 71/80
See application file for complete search history.

(56) References Cited

U.S. PATENT DOCUMENTS

| | | | |
|---|---|---|---|
| 7,943,440 | B2 | 5/2011 | Kim et al. |
| 9,698,160 | B2 | 7/2017 | Wu et al. |
| 10,832,935 | B2 | 11/2020 | Bower et al. |

(Continued)

FOREIGN PATENT DOCUMENTS

| | | |
|---|---|---|
| KR | 20190097062 A | 8/2019 |
| WO | 2018096455 A1 | 5/2018 |
| WO | 2020170219 A1 | 8/2020 |

OTHER PUBLICATIONS

WIPO: PCT International Search Report and Written Opinion
relating to PCT application No. PCT/CA2021/051610, dated Jan.
25, 2022.

(Continued)

*Primary Examiner* — Jonathan Han

(57)      ABSTRACT
The present disclosure relates to development of microde-
vices on a substrate that can be released and transferred to
a system substrate. The disclosure further relates to methods
to integrate anchors to hold a microdevice to a substrate. The
microdevices are in different configurations with respect to
anchors, release layers, buffers layers and substrate.

18 Claims, 13 Drawing Sheets

(56) References Cited

U.S. PATENT DOCUMENTS

| | | | |
|---|---|---|---|
| 2014/0363928 A1* | 12/2014 | Hu ....................... | H10H 20/832 |
| | | | 438/125 |
| 2018/0151804 A1* | 5/2018 | Chaji ................. | G01R 31/2635 |

OTHER PUBLICATIONS

KIPO: KR Office Action relating to KR application No. 10-2023-7019551, dated Sep. 30, 2025.
ROC (Taiwan): TW Office Action relating to TW application No. 110142258, dated Jul. 1, 2025.

* cited by examiner 198-2

198-2        198-2

182

190

3112     3114          3110          3116

3308

3304

3306

3300

OPTOELECTRONIC MICRODEVICE

BACKGROUND AND FIELD OF THE INVENTION

The invention relates to development of microdevices on a substrate that can be released and transferred to a system substrate.

SUMMARY

The present invention relates to method to integrate anchors for holding microdevices to a substrate, the method comprising, forming at least one microdevice on a first substrate, having pads on the microdevice on a top side away from the first substrate, covering microdevices by passivation layers and covering the microdevice with a protection layer.

In another related embodiment the invention relates a method to transfer an optoelectronic microdevices, the method comprising, having microdevice on a substrate, covering at least a part of a first microdevice facing the substrate by a first release layer and also having at an anchor to hold the microdevices to hold to the substrate.

In another embodiment, the invention relates to a method to integrate anchors for holding a microdevice to a substrate, the method comprising, forming at least two anchors around each microdevice, and having the anchors for the adjacent microdevices offsetted. Here the release layer can be formed under each microdevice.

In another embodiment, the invention relates to a method to integrate anchors to hold a microdevice to a substrate, the method comprising, having a structure with a microdevice, a stage, a release layer, and an anchor, coupling microdevices to the stage with the release layer, covering part of a surface of the microdevice and the stage with the anchor layer, and having the structure on a substrate.

In another embodiment, the invention relates to a method integrate anchors to hold a microdevice to a substrate, the method comprising, forming an anchor on a top of a substrate, separating at least a part of the anchor from the substrate with a release layer, and coupling a microdevice to the anchor with a bonding agent.

BRIEF DESCRIPTION OF THE DRAWINGS

The foregoing and other advantages of the disclosure will become apparent upon reading the following detailed description and upon reference to the drawings.

Figure 1A:
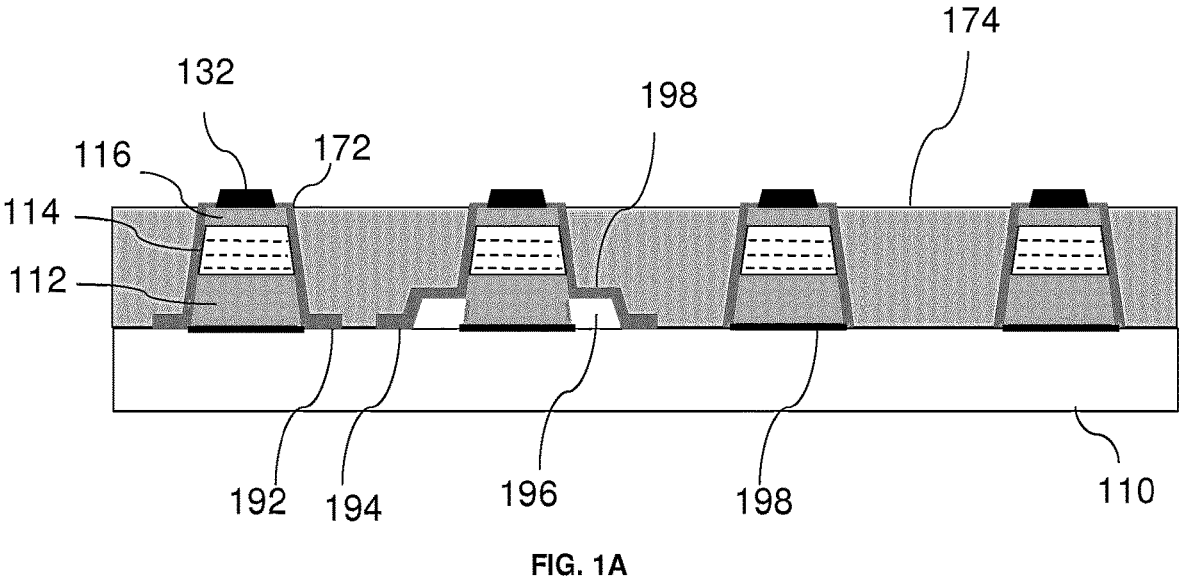
FIG. 1A illustrates a cross-sectional view of microdevices with different anchors in a filling layer.

The present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

In this description, the term "device" and "microdevice" are used interchangeably. However, it is clear to one skilled in the art that the embodiments described here are independent of the device size.

Microdevices can be microLED, OLED, microsensors, MEMs, and any other type of devices.

In one related embodiment, stages are formed on the donor substrate, and microdevices are coupled to the stage through adhesive or release layer. Anchor can be holding the microdevices to the stage temporarily. The donor substrate can be aligned with a receiver substrate and a selected set of microdevices are bonded to the receiver substrate. The donor and receiver substrates are moved away and a selected set of microdevices are transferred to the receiver substrate. Here, the adhesive, release layer or anchor force is weaker than the bonding of the microdevices to the receiver substrate.

In another embodiment shown in FIG. 1A, a mesa structure is developed on a donor substrate 110, as hereinbefore described, with microdevice structures formed by etching through different layers, e.g., a first bottom conductive layer 112, functional layers, e.g., light-emitting, 114, and a second top conductive layer 116. A top contact pad 132 may be deposited before or after the etching on top of the top conductive layer 116. Also, each microdevice may include other passivation layers and/or MIS layer 172 surrounding each microdevice for isolation and/or protection. In this embodiment the devices may be provided with different anchors, whereby after liftoff of the devices, the anchor holds the device to the donor substrate 110. The lift off may be done by laser. In an example, only the devices are scanned by a laser. In an embodiment a mask may be used that has an opening for the device only at the back of the donor substrate 110 to block the laser from the other area. The mask can be separate or part of the donor substrate 110. In another case, another substrate can be connected to the devices before the liftoff process to hold the devices. In another case, a filler layer 174, e.g., dielectric, may be used between the devices.

In a first illustrated case, a layer 192 is provided to hold the device to the donor substrate 110. The layer 192 may be a separate layer or part of the layers of the microdevices that are not etched during development of mesa structure. In another case, layer 192 may be the continuation of one of layer 172. In this case, the layer 192 may be either a metal or dielectric layer (SiN or SiO2, or other materials). In another case, the anchor is developed as a separate structure comprising extensions 194, a void/gap 196, and/or a bridge 198. Here, a sacrificial layer is deposited and patterned with the same shape as the gap/void 196. Then the anchor layer is deposited and patterned to form the bridge 198 and/or the extension 194. The sacrificial material may be removed later to create the void/gap 196. One can avoid the extension 194 as well. Similar to the previous anchor 192, another anchor may be made of different structural layers. In another case, the filling layers 174 act as anchor. In this case, the filling layers 174 can be etched or patterned or left as it is.

Figure 1B:
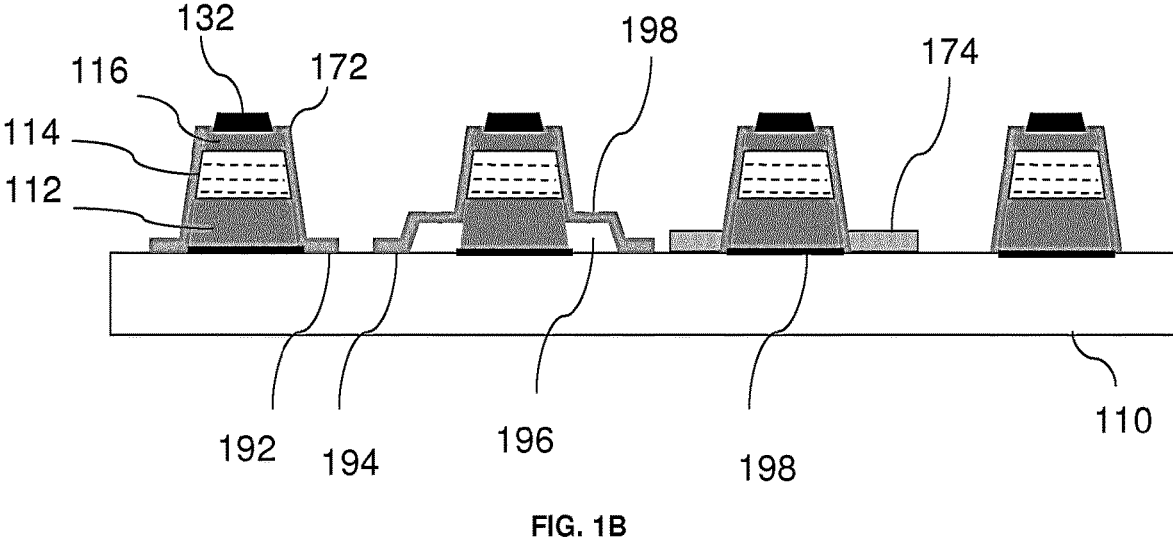
FIG. 1B illustrates a cross-sectional view of microdevices after post processing the filling layer.

FIG. 1B illustrates the samples after removing the filler layer 174 and/or etching the filler layer to create the anchor. In another case, the adhesive force of the bridge layer 198 after liftoff is enough to hold the device in place and act as an anchor. The final device is on the right side of the substrate 110. Here, after liftoff, some residue may stay under the device acting as an adhesive bridge layer 198.

FIG. 1B is shown in one substrate 110 for illustration purposes only. One can use either one or combination of them in a substrate.

Figure 1C:
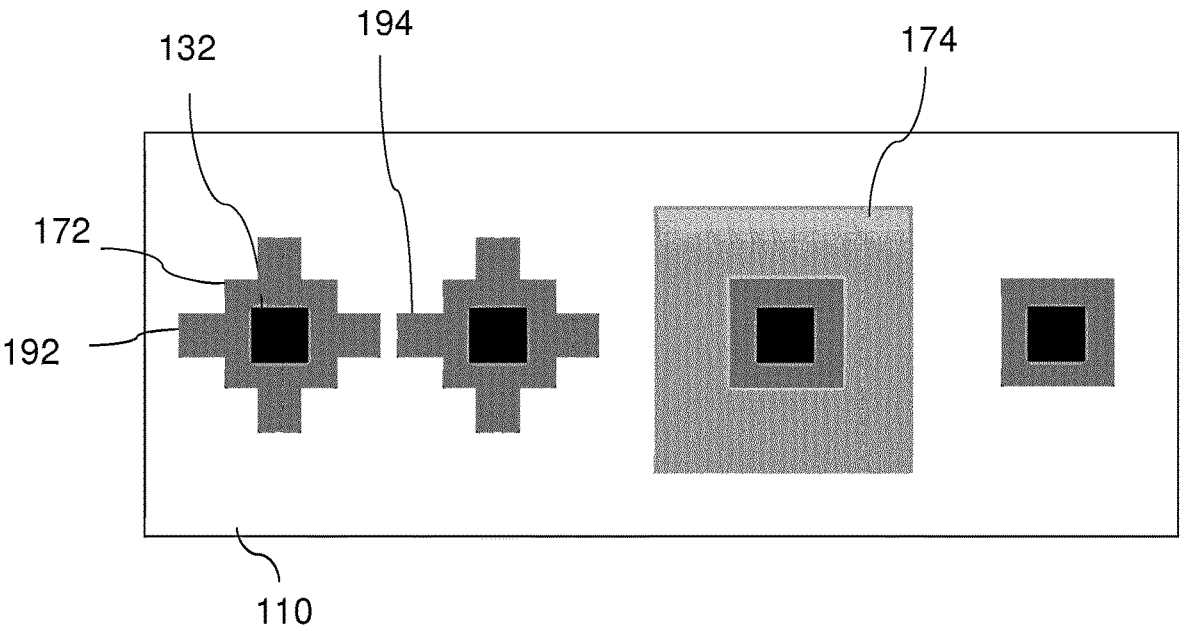
FIG. 1C illustrates a top view of the microdevices of FIG. 1B.

As shown in FIG. 1C, the anchor may be covering at least a portion of or the entire periphery of the device or can be patterned to form arms 194 and 192. Either of the structures may be used for any of the anchor structures.

Figure 1D:
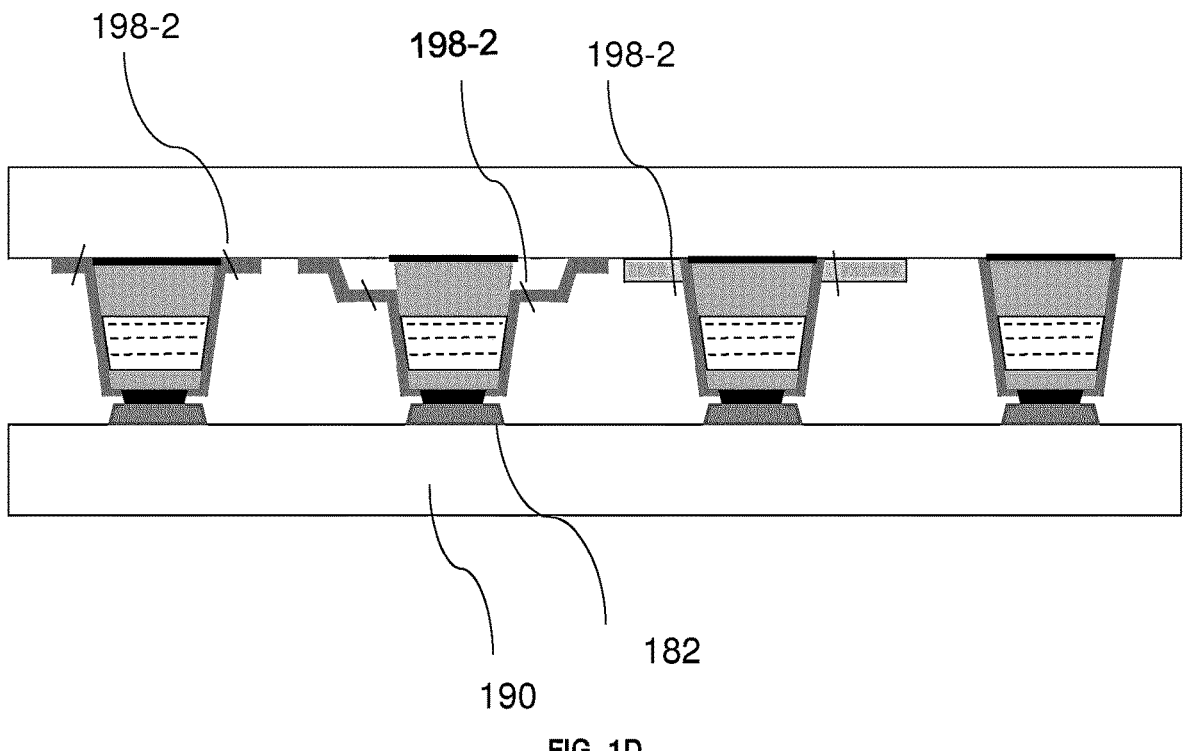
FIG. 1D illustrates a cross-sectional view of the transfer step used for transferring the microdevices to another substrate.
Figure 1E:
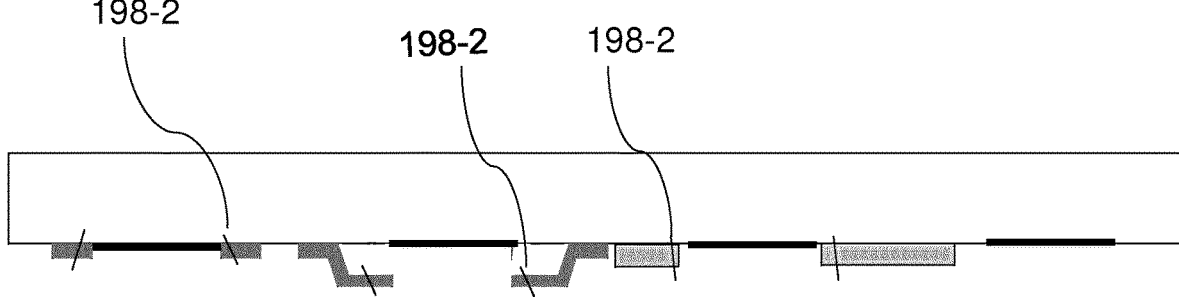
FIG. 1E illustrates a cross-sectional view of transferred microdevices to the substrate.
Figure 1E:
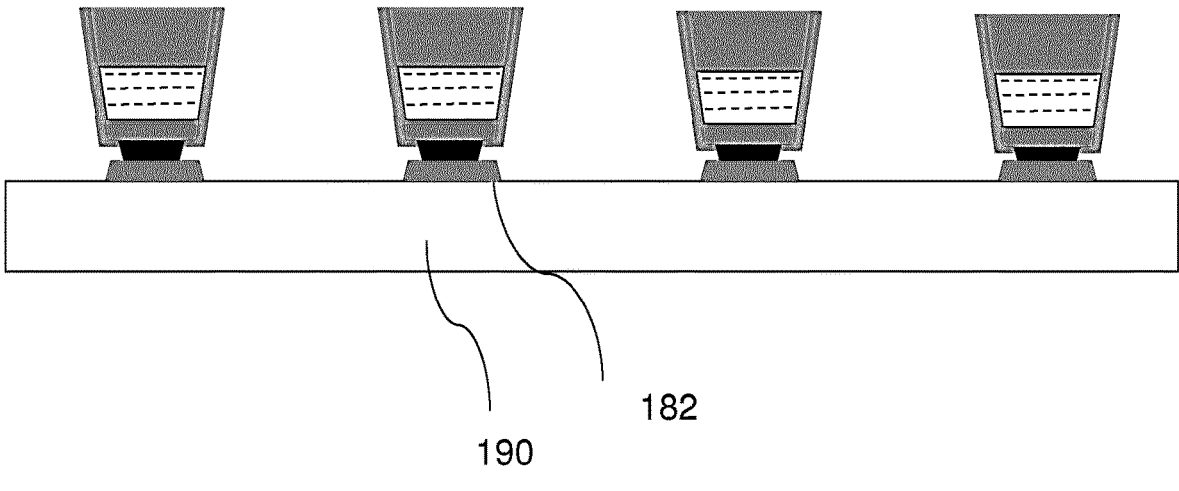

FIG. 1D illustrates one example of transferring the devices to a receiver substrate 190. Here the microdevices are bonded to the pads 182 or placed in a predefined area without any pads. The pressure force or separation force may release the anchor by breaking them. In another case, temperature may also be used to release the anchor. The viscosity of the layer between lift off of the microdevice and donor substrate 110 may be increased to act as an anchor by controlling the temperature. FIG. 1E illustrates the devices after being transferred to the receiver substrate 190 and shows the possible release point 198-2 in the anchors. The anchor may also be directly connected to the donor substrate 110 or indirectly through other layers.

The devices on donor substrate may be developed to have two contacts on the same side facing away from the donor substrate 110. In one case, the devices may be transferred to the receiver substrate 190 directly from the donor substrate 110. Here, the contacts on the same side facing away from the donor substrate 110 may be bonded directly to the receiver substrate pads 182. The devices may be tested either in the donor 110 or in the cartridge substrate. In another embodiment, the devices may be transferred to a cartridge substrate first from the donor substrate 110 prior to being transferred to the receiver substrate 190. Here, the contacts on the same side facing away from the donor substrate 110 will not be directly bonded to the receiver substrate 190, i.e. the receiver substrate 190 does not need to have special pads 182. In this case, conductive layers are deposited and patterned to connect the contacts to proper connection in the receiver substrate 190.

In one case, the microdevice has a functional body and contacts. The contacts can be electrical, optical or mechanical contacts.

In the case of optoelectronic microdevices, the device can have functional layers and charge carrying layers. Where charge carrying layers (doped layers, ohmics and contacts) transfer the charges (electron of hole) between the functional layers and contacts outside the device. The functional layers can generate electromagnetic signals (e.g., lights) or absorb electromagnetic signals.

System substrates can have pixels and pixel circuits that each pixel control at least one microdevice. Pixel circuits can be made of electrodes, transistors, or other components. The transistors can be fabricated with a thin film process, CMOS, or organic materials.

Figure 2A:
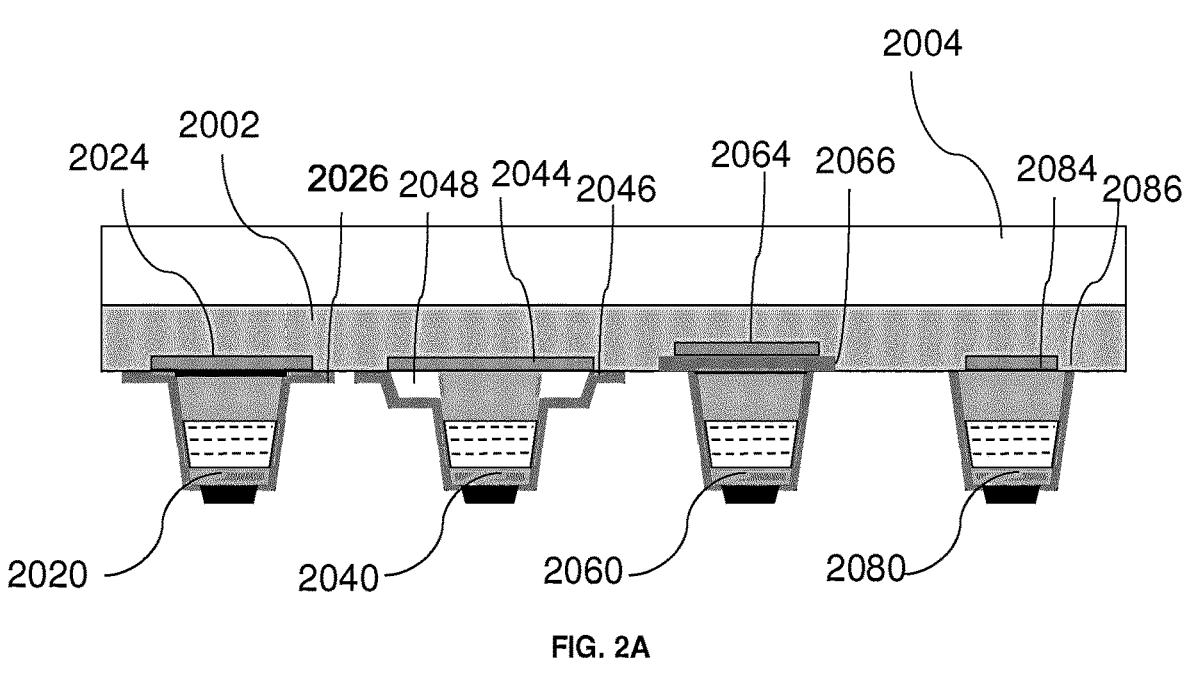
FIG. 2A shows the microdevices on a substrate and a release layer covering part of the microdevices.

In one embodiment, as shown in FIG. 2A, the microdevice (2020, 2040, 2060, 2080) is on a substrate 2004 and a release layer (2024, 2044, 2064, 2084) at least covers part of the microdevice (2020, 2040, 2060, 2080) surface facing the substrate 2004. There can be a buffer layer 2002 between the substrate 2004 and microdevice (2020, 2040, 2060, 2080). In one case, at least one anchor (2026, 2046, 2066, 2086) holds the microdevice (2020, 2040, 2060, 2080) to the substrate or buffer layer.

In one case, the anchor 2026 is formed as an extension of a layer covering at least part of the microdevice 2020. Here, part of the anchor is not covered by the release layer 2024 so it is coupled to the buffer or substrate layer.

In another related case, there is a gap 2048 between the extension layer forming the anchor 2046 and at least part of the microdevice 2040.

In another related case, the anchor 2066 is formed as a layer covering at least part of the microdevice 2060 surface facing the substrate 2004.

In another case, the anchor 2086 is formed as part of the microdevice 2080. Here, the release layer 2084 is not covering part of the surface of the device 2080 facing the substrate 2004. As a result, the part not covered 2086 can couple to the substrate or buffer layer. Here, the buffer layer can be adhesive, polymer, or metal.

Figure 2B:
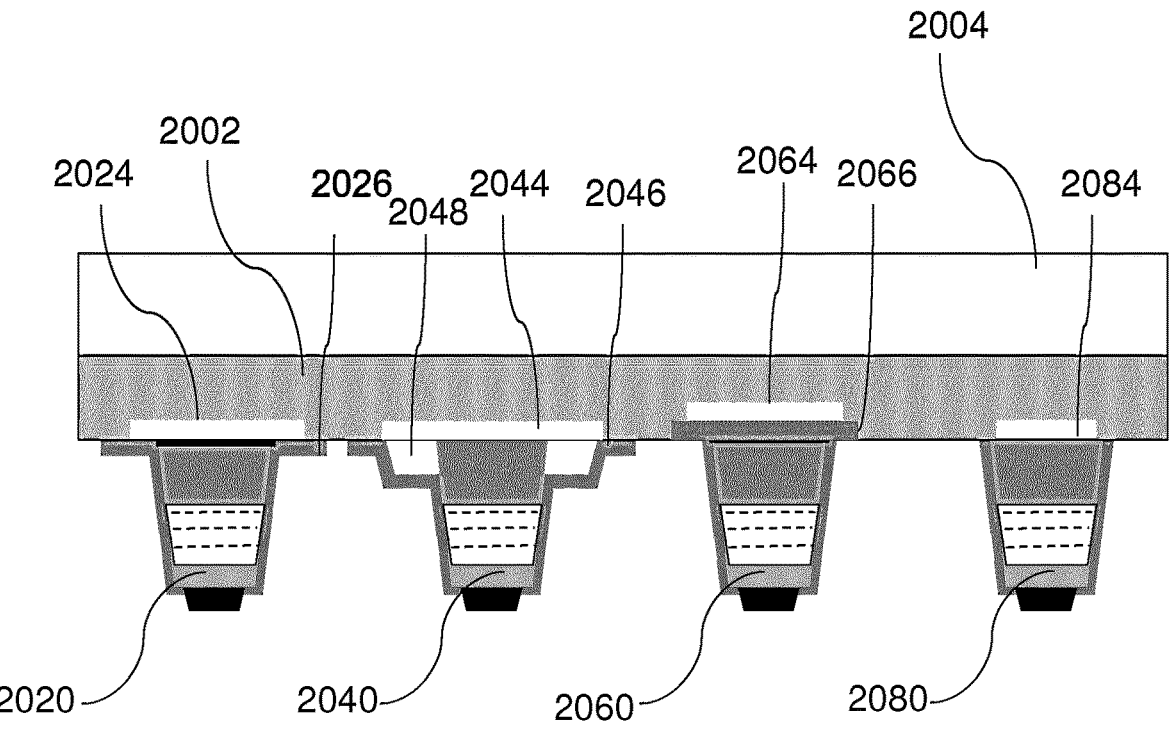
FIG. 2B shows the devices are held to the substrate through the anchors after the release layers are deactivated or removed.

After the release layers are deactivated or removed, as shown in FIG. 2B, the microdevices (2020, 2040, 2060, 2080) are held to the substrate through the anchors. The devices can be now transferred to a system substrate as explained in FIG. 1A-1E.

The release layer can be deactivated optically, chemically, thermally, or mechanically.

In case of chemical deactivation or removal, part of the release layer is exposed so that the chemical (e.g., solvent, etchant, or other chemicals) can penetrate and remove the release layer.

In case of an optical release layer, the substrate is transparent to a specific wavelength that can deactivate the release layer.

Figure 2C:
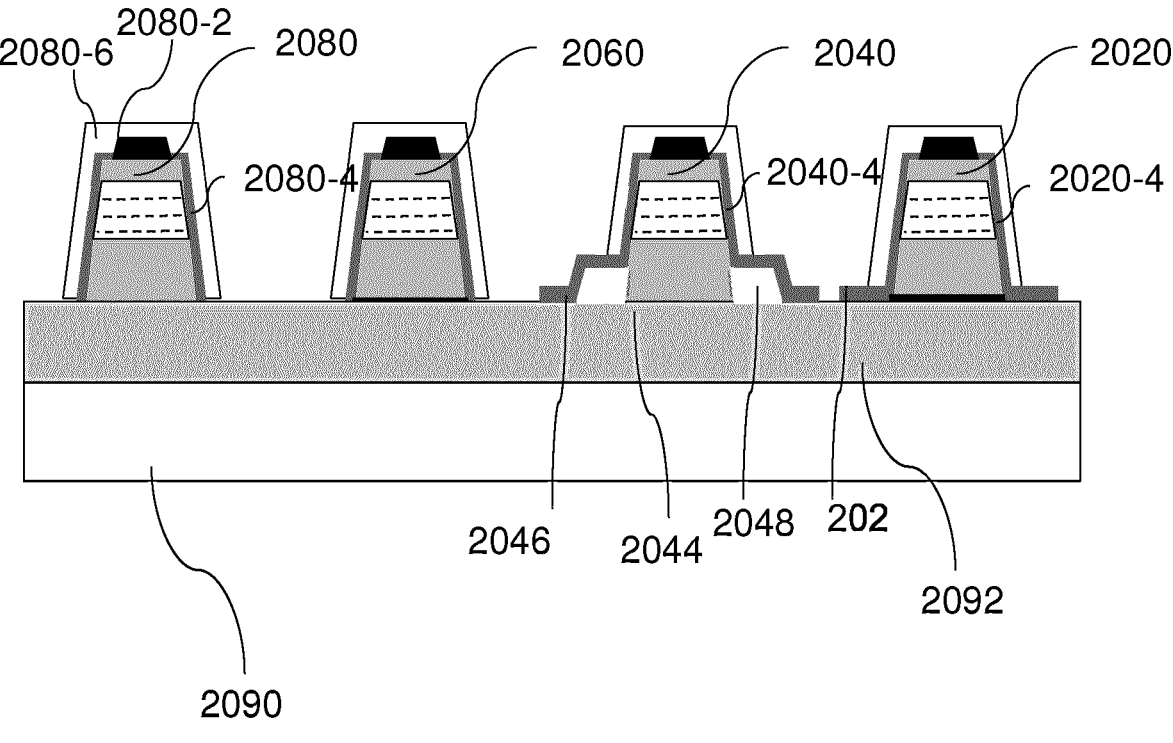
FIG. 2C shows the first substrate and buffer layer are removed from the microdevices.
Figure 2D:
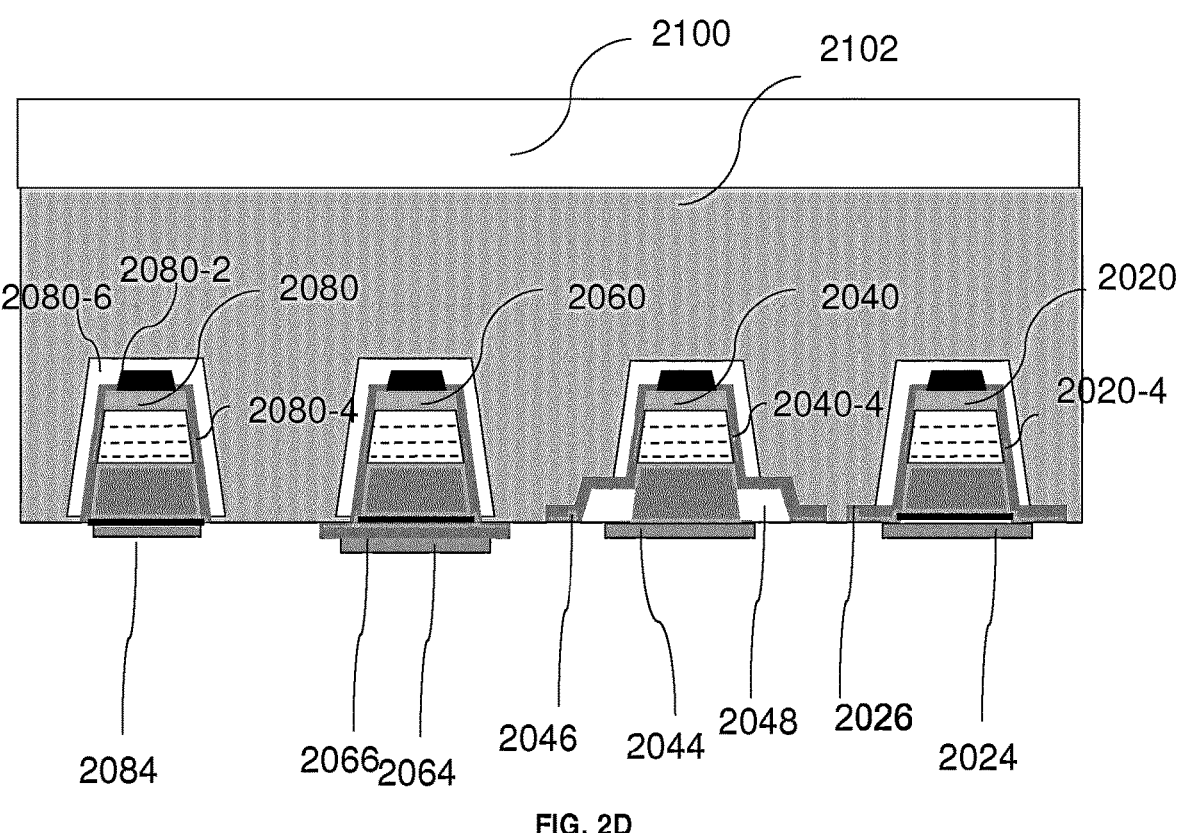
FIG. 2D shows a release layer being deposited and patterned.

One method of developing microdevices ready for transferring microdevices into a system substrate is described in FIGS. 2C-2D.

In one step, at least one microdevice 2080, 2060, 2040, 2020 is formed on the first substrate 2090. The microdevices can have pads 2080-2 allowing electrical connection to the microdevices on the top side (the top side is the side away from the first substrate). The microdevices can be covered by passivation layers 2080-4. In addition, the microdevice can be covered by a protection layer 2080-6 that protects microdevices from the subsequent steps (part of the protection layer can be removed after the process is completed). In one related case (2040, 2020), part of the passivation layers 2040-4, 2020-4 can be patterned to form anchors 2046 and 2026. In one case, a void structure is formed 2048 under part of the anchor. There can be a buffer layer 2092 between devices and substrate.

The microdevices are bonded to a second substrate 2100 using a bonding layer 2102 and planarization layer 2102 (The two layers can be the same). As demonstrated in FIG. 2C, the first substrate 2090 and buffer layer 2092 are removed from the microdevices. Here, the anchor layer is deposited 2066 (it can be patterned at this stage). The anchor layer 2066 can be dielectric or metal or other types of materials. As shown in FIG. 2D, a release layer is deposited 2024, 2044, 2064, 2084 and patterned. The release layer is extended at least from part of the microdevice edge. The anchor layer 2066 can be a combination of multiple layers or one layer. The anchor layer 2066 can be changing under different conditions such as temperature, electrical bias, or lights to push the microdevices forward. The microdevices can have pads on the bottom side as well and can have passivation layers (The passivation and anchor layers can be the same).

As demonstrated in FIG. 2A microdevices can be bonded to a third substrate 2004 and removed from the second substrate.

The planarization and first bonding layer are removed. The anchors can be patterned at this stage if it is not patterned. To protect the devices during removal of the release layer (FIG. 2B), the devices can be covered by a second protection layer. The second protection layer can be photoresist.

To pack microdevices close to each other for higher utilization of original wafers, the anchors need to be modified. In one case, an anchor of a microdevice and an anchor of its adjacent devices on a donor/cartridge substrate, are offsetted from each other to provide more room for integration of anchors. In another related case, the anchors are formed on the sidewall of a stage. In another case, the stage and the anchor structure are formed underneath the microdevice.

Figure 3A:
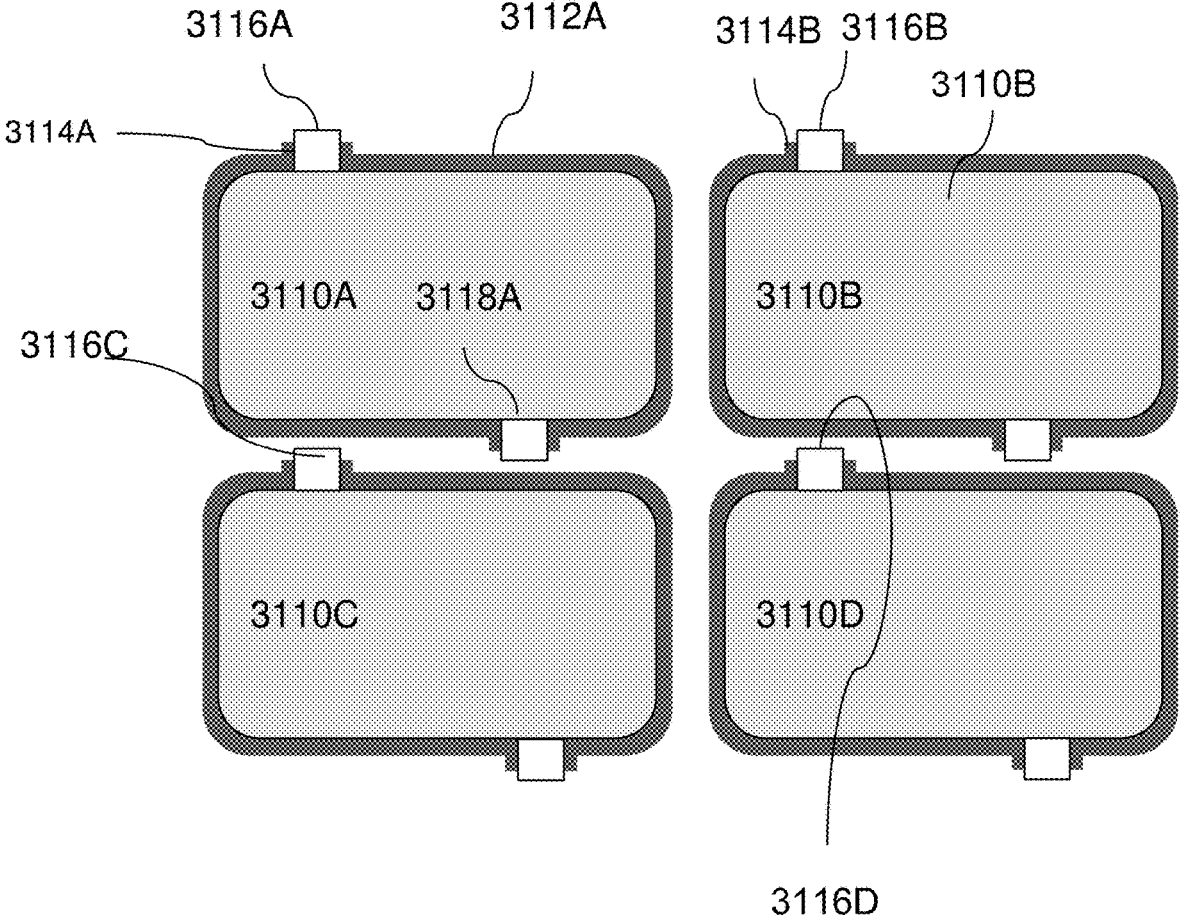
FIG. 3A shows a case of offsetted anchors.

FIG. 3A shows an exemplary case of offsetted anchors. Microdevices 3110A and 3110C are adjacent to each other on a donor/cartridge substrate. The anchors 3116A, B, C, and D and 3114A, B, C, and D (the anchors are repeated for each device 3110A, B, C, and D and the numbering also includes the anchor labels A, B, C, and D) are formed around the device. The release layer 3112A formed under microdevice 3110A (the microdevice and microdevice structures are repeated for each device 3110A, B, C, and D and the numbering also includes the device labels A, B, C, and D). Here, for example, the anchors 3114B and 3116C are offsetted.

Figure 3B:
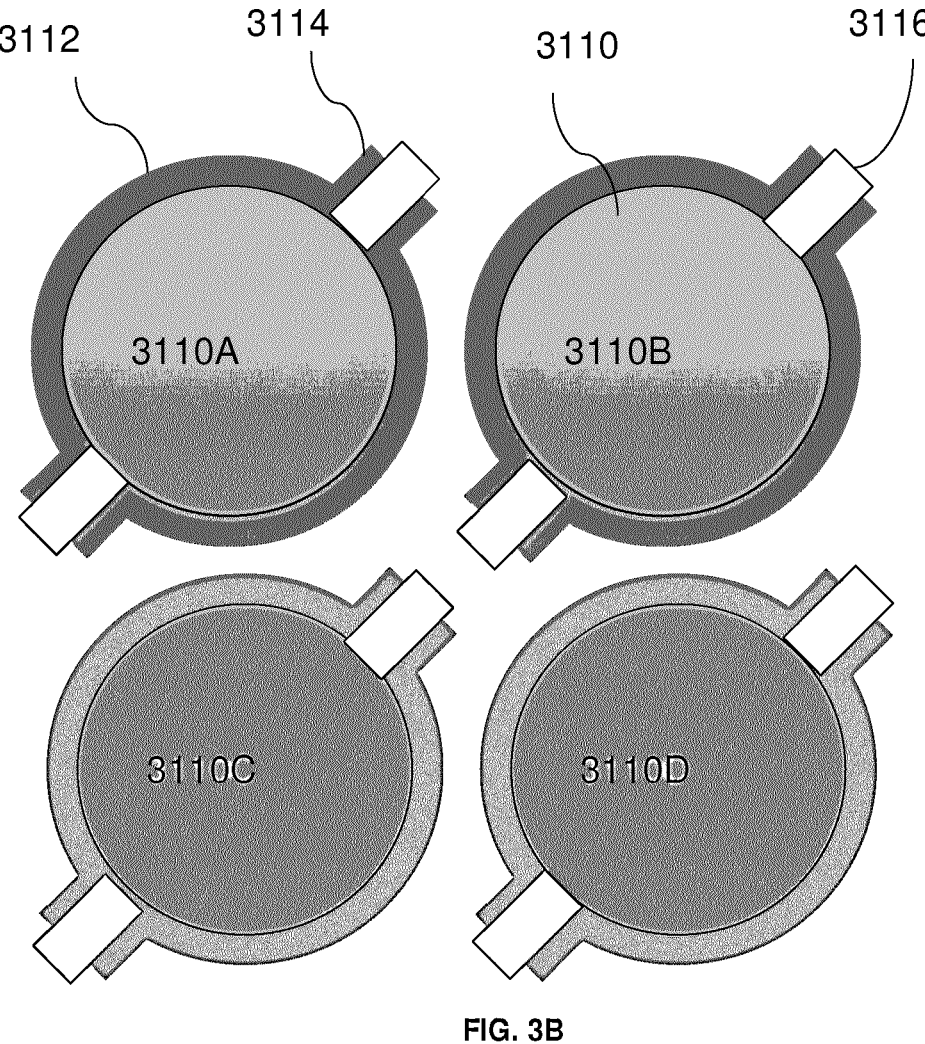
FIG. 3B shows another case of offsetted anchors.

FIG. 3B shows another example of offsetted anchors. Microdevices 3110A and 3110C are adjacent to each other. The anchors 3116A and 3114A are formed around the device. The release layer 3112 formed under the microdevice 3110A (the microdevice and microdevice structures (anchors) are repeated for each device 3110A, B, C, and D, and the numbering also includes the device/anchor labels A, B, C, and D). Here, for example, the anchors 3114A and 3116C are offsetted.

Figure 4A:
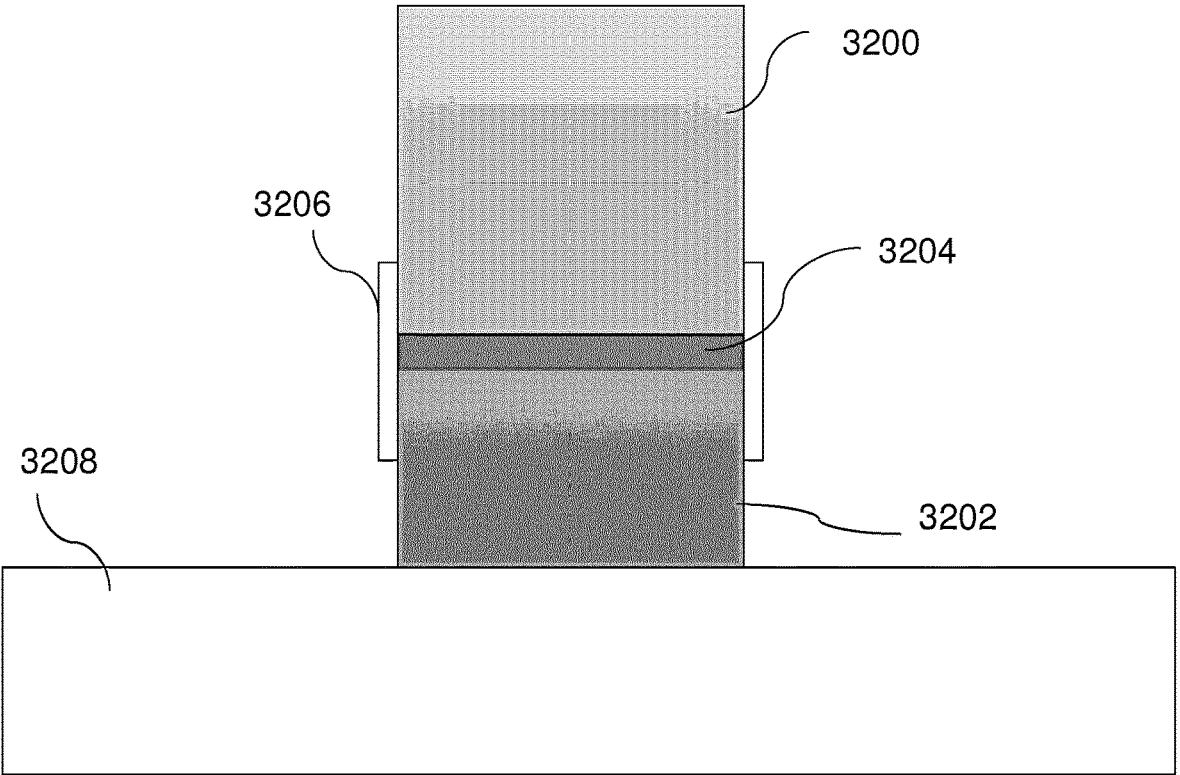
FIG. 4A shows a microdevice formed on top of a stage.
Figure 4B:
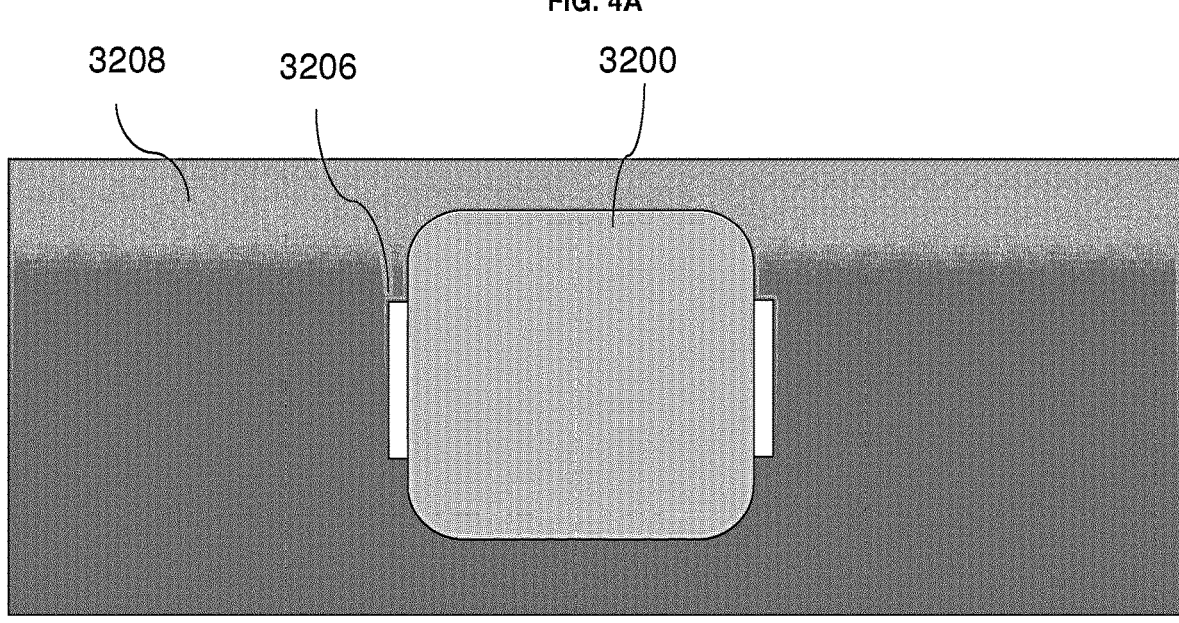
FIG. 4B shows the top view of the structure in FIG. 4A.

Another related example presented in FIG. 4A. Here, microdevice 3200 is formed on top of a stage 3202. There is a release layer 3204 coupling microdevice 3200 into the stage 3202. The release layer can be adhesive. In another related embodiment, the release layer can be multi-layer including an adhesive. The adhesive layer can be deactivated using different factors such as temperature, chemical, electrical, charge or so on. There can be other adhesive layers between microdevice 3200 and stage 3202. The stage 3202 can be polymer or dielectric or conductive. Anchor 3206 can be formed on part of microdevice 3200 and stage 3202. The structure is on a substrate 3208. The anchor 3206 can cover part of the other surface of microdevices 3200. The anchor 3206 can cover part of the surface of the substrate 3208. FIG. 4B shows the top view of the structure in FIG. 4A. In another related embodiment, the stage is formed on a microdevice. Here the release layer is formed and patterned. After that, the stage material is formed. The stage can be deposited using different techniques such as printing, spray coating, PECVD, e-beam sputtering and so on. The stage is then bonded to the substrate 3208 and the microdevices are separated from the original substrate. In another related embodiment, the stage is formed on the substrate 3208. The stage can include the release layer and the adhesive layer. The stage is bonded to the microdevices using different techniques such as thermal compression. For all related embodiments, the anchor can be formed after the stage and the microdevices are coupled. Here, the anchor layer is deposited and patterned. The patterning can be liftoff, lithography, or etching (dry or wet).

Figure 5A:
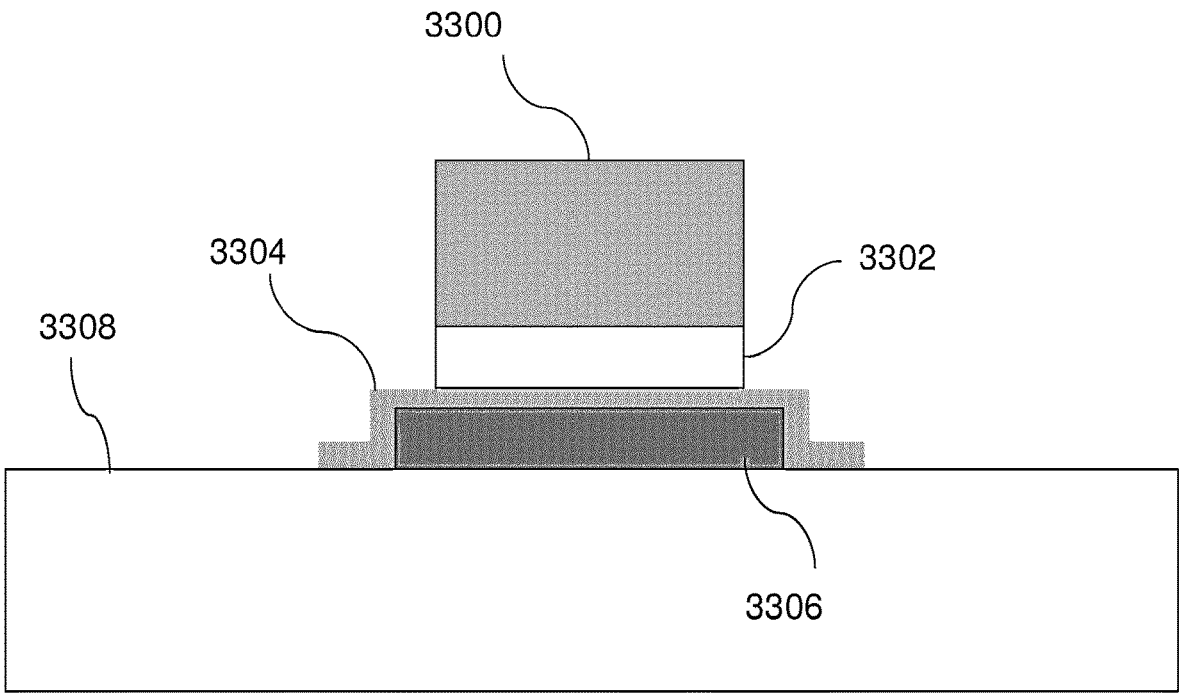
FIG. 5A. shows an anchor is formed on top of a substrate.
Figure 5B:
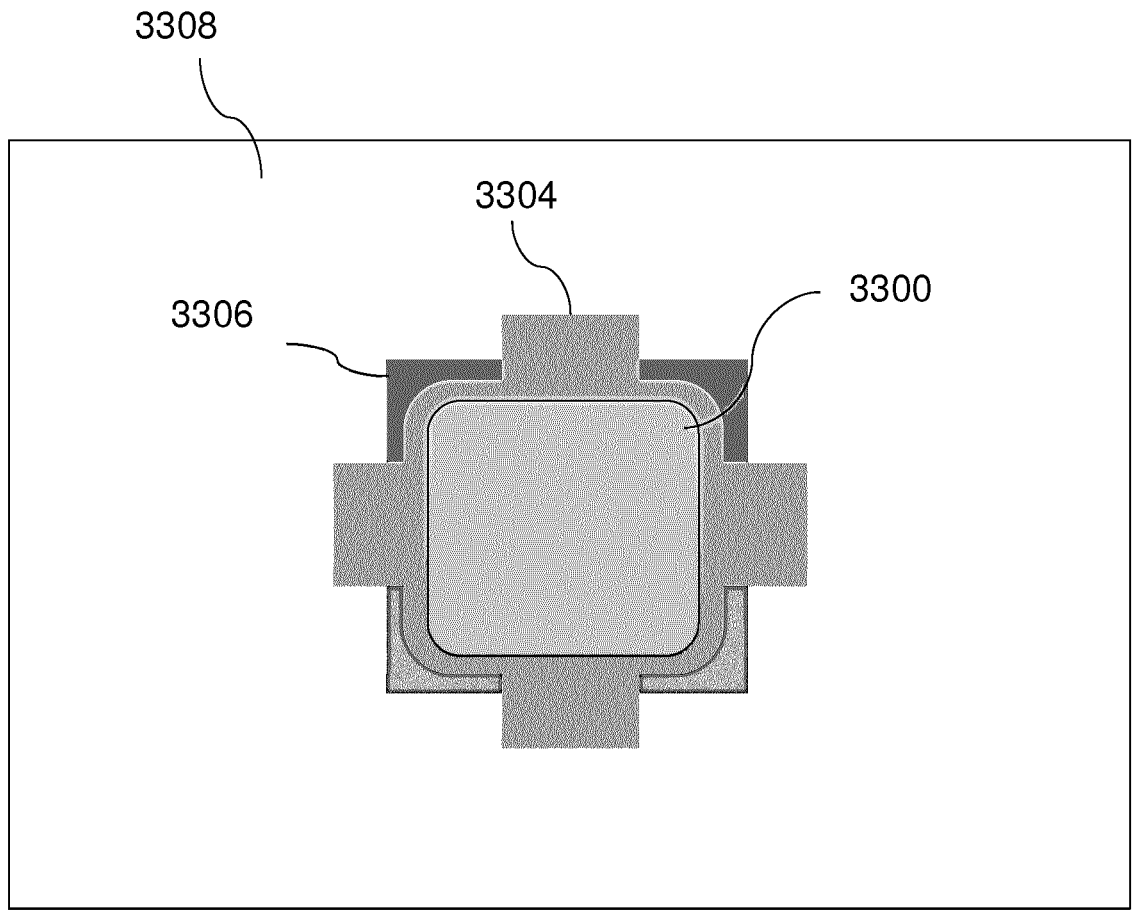
FIG. 5B shows the top view of the example of FIG. 5A.

Another related example presented in FIG. 5A. Here, an anchor 3304 is formed on top of a first stage 3306 on the substrate 3308 where part of the anchor is connected to the substrate. The first stage 3306 can include a release layer 3306 separates at least part of the anchor 3304 from the substrate 3308. There is a second stage formed on top of the anchor surface 3302. The second stage can consist of different layers, and it may include adhesive or dielectric or metal or different materials. In one related embodiment, the microdevice 3300 is coupled to the anchor structure 3304. Here, the microdevice 3300 is coupled to the anchor surface 3304 using the second stage (e.g., Adhesive, or bonding agent) 3302. In another related embodiment, the second stage is formed on the microdevices and bonded to the anchor surface 3304. After these related embodiments, the microdevices are separated from the original substrate after coupling to the anchor. The formation of the second stage (or at least part of it) can be selective. As a result, a selective set of microdevices are coupled with the anchor surface. To enable the transfer the release layer is removed or deformed so that the microdevice can be easily removed by breaking the anchor. FIG. 5B shows the top view of the example of FIG. 5A. One method to form the anchor in FIG. 5A is to form the anchor and release layer in substrate 3308 and the microdevice is then bonded to the structure of the anchor using bonding layer 3302. In another method, the anchor and release layers are formed on the microdevice and then the microdevice with the structure is bonded to the substrate 3308.

Figure 5C:
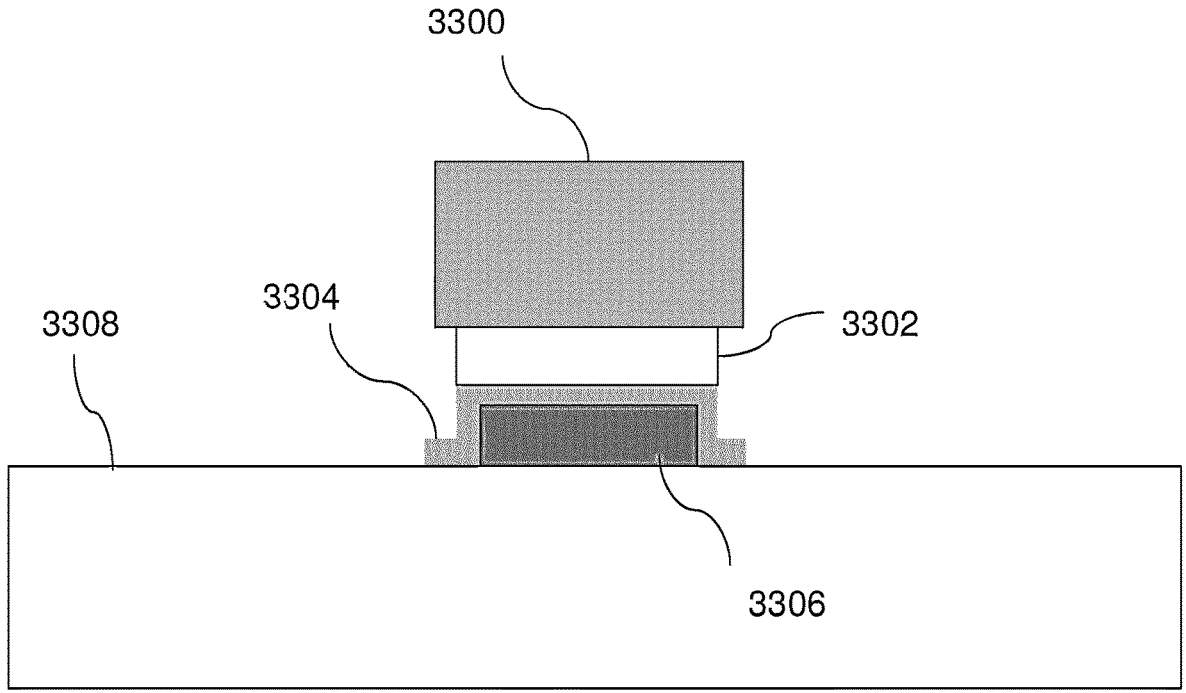
FIG. 5C shows where the main part of the anchor and release layer are under the microdevice.

FIG. 5C is the same example of FIG. 5A. Here, it shows where the main part of the anchor 3304 and release layer 3306 are under the microdevice 3300. As a result, the microdevices can be packed closer to each other.

In another related embodiment for FIG. 5. At least part of the second stage is formed selectively. Here a selected set of microdevices are transferred from the original substrate to the donor substrate 3308 with the stage.

In another related embodiment for FIG. 5, the anchor and the first stage are the same.

The substrate in FIGS. 2, 3, 4, and 5 can have a stack of layers such as buffer layers. The anchor in FIGS. 2, 3, 4, and 5 can be developed using any of the methods described in this document or other approaches.

Method Aspects

The invention disclose a method to integrate anchors for holding microdevices to a substrate, the method comprising, forming at least one microdevice on a first substrate, having pads on the microdevice on a top side away from the first substrate, covering microdevices by passivation layers and covering the microdevice with a protection layer.

The method further comprises wherein parts of the passivation layers can be patterned to form first and second anchors and wherein a void structure may form under a part of the anchor. Furthermore, the microdevices are bonded to a second substrate using a bonding layer and a planarization layer. Moreover, the first substrate and the buffer can be removed, and a third anchor layer may be deposited.

According to the method, there is a buffer layer between the microdevice and the first substrate. Furthermore, the third anchor can be a dielectric, or a metal and a release layer is deposited on the microdevices and patterned. Additionally, the release layer is extended at least from a part of a microdevice edge. Here, the third anchor can be a combination of multiple layers, and may change under different conditions such as temperature, electrical bias, or lights to push the microdevices forward. Further, the microdevices have pads on the bottom side and also have passivation layers.

Also, the microdevices may be bonded to a third substrate and removed from the second substrate. Here, the planarization layer and the first bonding layer can be removed, and the anchors are patterned and in addition the microdevices can be covered by a second protection layer during removal of the release layer. Here, the second protection layer may be a photoresist.

In another related embodiment the invention discloses a method to transfer an optoelectronic microdevices, the method comprising, having microdevice on a substrate, covering at least a part of a first microdevice facing the substrate by a first release layer and also having at an anchor to hold the microdevices to hold to the substrate. Here, there can be a buffer layer between the substrate and the microdevices and wherein further the anchor may hold the microdevice to hold to the substrate or the buffer layer. In addition, the anchor maybe formed as an extension of a layer covering at least part of the microdevice and a part of the anchor not covered by the release layer may be coupled to the buffer layer or substrate.

The method further comprises potentially having a gap between an extension layer forming the anchor and at least part of the microdevice and wherein the anchor may be formed as a layer covering at least part of a surface of the microdevice facing the substrate. Moreover, the anchor may be formed as part of the microdevice. Here, a release layer corresponding to the anchor may not cover part of the surface of the microdevice facing the substrate and the part of the surface of the microdevice facing the substrate not covered may be coupled the substrate or buffer layer. Further, the buffer layer can be an adhesive, a polymer, or a metal. Further, the release layers may be deactivated or removed, and the microdevices can be held to the substrate through the anchors. Here the release layer can be deactivated optically, chemically, thermally, or mechanically. In case of chemical deactivation or removal, part of the release layer may be exposed so that a chemical can penetrate and remove the release layer. In case of for the optical deactivation, the substrate can be transparent to a specific wavelength that can deactivate the release layer.

In another embodiment, the invention relates to a method to integrate anchors for holding a microdevice to a substrate, the method comprising, forming at least two anchors around each microdevice, and having the anchors for the adjacent microdevices offsetted. Here the release layer can be formed under each microdevice.

In another embodiment, the invention relates to a method to integrate anchors to hold a microdevice to a substrate, the method comprising, having a structure with a microdevice, a stage, a release layer, and an anchor, coupling microdevices to the stage with the release layer, covering part of a surface of the microdevice and the stage with the anchor layer, and having the structure on a substrate.

In another embodiment, the invention relates to a method integrate anchors to hold a microdevice to a substrate, the method comprising, forming an anchor on a top of a substrate, separating at least a part of the anchor from the substrate with a release layer, and coupling a microdevice to the anchor with a bonding agent. Here the release layer maybe removed or deformed to enable the microdevice to be separated from the substrate. Further, the anchor and release layer are formed on the substrate and bonding the microdevice to the anchor.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

The invention claimed is:

1. A method to integrate anchors for holding microdevices to a substrate, the method comprising:
    forming at least one microdevice on a first substrate wherein a release layer is deposited only on the at least one microdevice and patterned, and the release layer is extended at least from a part of a microdevice edge of the at least one microdevice;
    having pads on the microdevice on a top side away from the first substrate;
    covering microdevices by passivation layers; and
    covering the microdevice with a protection layer.

2. The method of claim 1, wherein parts of the passivation layers are patterned to form first and second anchors.

3. The method of claim 2, wherein a void structure is formed under a part of the anchor.

4. The method of claim 1, wherein there is a buffer layer between the microdevice and the first substrate.

5. The method of claim 3, wherein the microdevices are bonded to a second substrate using a bonding layer and a planarization layer.

6. The method of claim 5, wherein the first substrate and the buffer are removed, and a third anchor layer is deposited.

7. The method of claim 6, wherein the third anchor is a dielectric or a metal.

8. The method of claim 6, wherein the third anchor layer is a combination of multiple layers.

9. The method of claim 6, wherein the third anchor later is changing under different conditions such as temperature, electrical bias, or lights to push the microdevices forward.

10. The method of claim 6 wherein the microdevices have pads on the bottom side and also have passivation layers.

11. The method of claims 6, wherein the microdevices are bonded to a third substrate and removed from the second substrate.

12. The method of claim 11, wherein the planarization layer and the first bonding layer are removed, and the anchors are patterned.

13. The method of claim 12, wherein the microdevices are covered by a second protection layer during removal of the release layer.

14. The method of claim 13, wherein the second protection layer is a photoresist.

15. A method to integrate anchors for holding a microdevice to a substrate, the method comprising:
    forming at least two anchors around each microdevice wherein a release layer is formed under each microdevice, and the release layer is extended at least from a part of a microdevice edge; and having the anchors for the adjacent microdevices offsetted.

16. A method to integrate anchors to hold a microdevice to a substrate, the method comprising;

forming an anchor on a top of a substrate;

separating at least a part of the anchor from the substrate with a release layer deposited only on the microdevice and wherein the release layer is extended at least from a part of a microdevice edge; and coupling the microdevice to the anchor with a bonding agent.

17. The method of claim 16 where the release layer is removed or deformed to enable the microdevice to be separated from the substrate.

18. The method of claim 16, wherein the anchor and release layer are formed on the substrate and bonding the microdevice to the anchor.

\* \* \* \* \*